US009393921B1

(12) United States Patent
Weicker et al.

(10) Patent No.: US 9,393,921 B1
(45) Date of Patent: Jul. 19, 2016

(54) SOLID-STATE BATTERY MANAGEMENT USING REAL-TIME ESTIMATION OF NANO MATERIAL ELECTRICAL CHARACTERISTICS

(71) Applicant: QuantumScape Corp., San Jose, CA (US)

(72) Inventors: Phillip John Weicker, Pasadena, CA (US); Timothy M. Henigan, San Jose, CA (US)

(73) Assignee: QuantumScape Corporation, San Jose, CA (US)

(\*) Notice: Subject to any disclaimer, the term of this patent is extended or adjusted under 35 U.S.C. 154(b) by 0 days.

(21) Appl. No.: 14/685,308

(22) Filed: Apr. 13, 2015

(51) Int. Cl.
*G06F 7/00* (2006.01)
*B60R 16/033* (2006.01)
*G01R 31/36* (2006.01)

(52) U.S. Cl.
CPC .......... *B60R 16/033* (2013.01); *G01R 31/3651* (2013.01); *G01R 31/3662* (2013.01); *G01R 31/3675* (2013.01)

(58) Field of Classification Search
CPC ............. B60R 16/033; G01R 31/3651; G01R 31/3662; G01R 31/3675

USPC .......................................................... 701/36
See application file for complete search history.

(56) References Cited

U.S. PATENT DOCUMENTS 5,441,575 A \* 8/1995 Underwood ............. H01G 9/21
136/202

\* cited by examiner

*Primary Examiner* — Ian Jen
(74) *Attorney, Agent, or Firm* — Squire Patton Boggs (US) LLP

(57) ABSTRACT

Set forth herein are methods and systems for determining a rechargeable (i.e., secondary) battery's capability in real time, including how much power and energy can be discharged or charged, by compensating for the limitations of the standard battery model for cathode electron and ion transport restrictions in a solid-state battery. Set forth herein is also an equivalent circuit for each layer of a layered cathode (i.e., positive electrode) which is created using resistive, capacitive, and storage elements, including a state-of-charge (SOC) state variable and an SOC-dependent voltage source. In some embodiments, each layer is connected to adjoining layers using resistive elements to model ion and electron transport. In some embodiments, bulk ohmic resistance and ion exchange external to the electrode is represented using a Randles cell equivalent circuit.

27 Claims, 11 Drawing Sheets

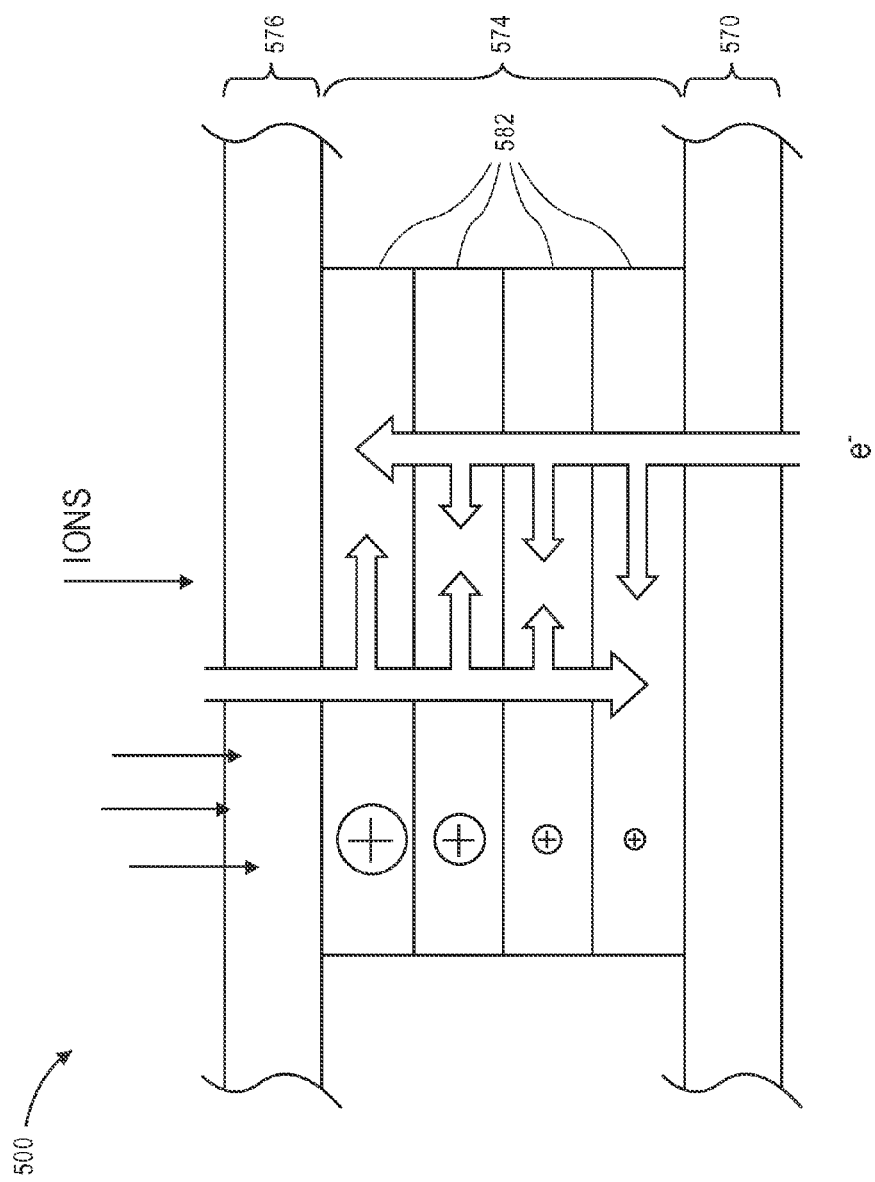

SOLID-STATE BATTERY MANAGEMENT USING REAL-TIME ESTIMATION OF NANO MATERIAL ELECTRICAL CHARACTERISTICS

CROSS-REFERENCES TO RELATED APPLICATIONS

NOT APPLICABLE

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Art

This disclosure is generally related to electrical battery control systems, and more specifically to supplying battery management systems that can model a solid-state battery (e.g., conversion chemistry positive electrode including an electrochemical cell), possibly employing conversion materials in the positive electrode, and providing state of charge and power limit information in real-time.

2. Background

Recently, with the shortage of fossil-fuels and an increasing awareness of the adverse environmental effects from consuming fossil-fuels, public and private sectors have researched alternative and environmentally friendly technologies for storing and delivering energy, some of which include rechargeable batteries (i.e., secondary batteries, e.g., traction batteries). While many types of rechargeable batteries have been developed, the respective advantages and disadvantages of each type has prevented the widespread commercialization of rechargeable batteries in many applications, particularly automotive applications (e.g., electric and hybrid vehicles), in part due to an inability to tailor and manage the energy and power for a given battery to a given application.

The suitability of a particular battery type(s) for a commercial application depends on the battery's physical and performance characteristics as well as the cost of the constituent materials and the associated methods of assembly. For automotive (e.g., electric and hybrid vehicles) applications, high power and energy capacity, wide voltage operation range, and mechanical durability are all desirable characteristics, but unfortunately many conventional battery devices are insufficient in at least one of these respects for current and future automotive demands. For electric automobiles, batteries should demonstrate both high energy density for long range driving and also high instantaneous power output for acceleration and/or braking scenarios. What can be critical to this demonstration is a battery management system that can accurately and efficiently determine energy and power capabilities of a pack of battery cells as well as control the charging and discharging of these cells to achieve certain threshold energy and power performance.

Lithium batteries with a solid-state electrolyte, as opposed to a liquid electrolyte, offer the promise of high energy capacity batteries that are safer (nonflammable) than current state of the art batteries. Unfortunately, such batteries tend to have a limited instantaneous power output capacity in certain conditions. This attribute may prevent their acceptance in the mass automobile market that demands acceptable vehicle performance in all temperature extremes.

Therefore, it is desirable to develop new systems and techniques for using solid-state rechargeable batteries.

BRIEF SUMMARY

Generally, a rechargeable solid-state battery's cathode is modeled as a series of layers. These layers may be physically distinct layers in the cathode itself, for example having different material compositions from one another, or they may be virtual layers within a homogenous region of the cathode. Each layer is modeled as an equivalent circuit of resistors, capacitors, ideal voltage sources, or other electrical components, and each layer is connected with at least one adjacent layer. Each layer's equivalent circuit is then represented by an equation derived from Kirchoff's and Ohm's laws. Each layer's equation is part of a set of linear equations, and because each layer shares voltage or current attributes with an adjoining layer, each layer's equation has dependencies on others and therefore must be solved simultaneously. In a battery management system (BMS) computer, the set of linear equations is solved in real-time, and the results are used to calculate an aggregate state of charge (SOC), a loaded terminal voltage, and instantaneous power limit of the battery. A load controller is then signaled to compensate for the results, such as by turning on an additional power source or turning off noncritical electrical loads.

In some embodiments, by determining the SOC and power limit, the BMS signals the load controller to modulate the power consumed by the power train so that the power train demand does not exceed the power capacity of the battery cells. In these and some other embodiments, by determining the SOC and power limit, the BMS signals the load controller to modulate the power consumed by the power train so that the power train demand does not exceed the power capacity of the battery cells such that the life of the battery cells is degraded. In these and some other embodiments, by determining the SOC and power limit, the BMS signals the load controller to modulate the power consumed by the power train so that the power train demand does not exceed the power capacity of the battery cells such that the safety of the battery system is not compromised.

Actual battery cell temperatures, load currents, loaded terminal voltages, and other measurements from sensors in the battery compartment can be used to update the values of the electrical components in the model. The values of the components that create the circuit that best models the battery's behavior depend on, for example, temperature, state of charge, battery age, and other factors. In some embodiments, the values of the components that create the circuit that models the battery's behavior depend on state of charge. In some embodiments, the values of the components that create the circuit that models the battery's behavior depend in the battery age. In some embodiments, the values of the components that create the circuit that models the battery's behavior depend on measurements, such as, but not limited to, cell temperatures, load currents, and loaded terminal voltages. In some embodiments, the values of the components that create the circuit that models the battery's behavior depend on calculated values, such as, but not limited to, SOC, battery age, hysteresis.

A measured terminal voltage can be compared with the computed terminal voltage to create a feedback loop that alters the impedance values and/or ideal voltage source values in the model.

Some embodiments set forth herein are related to a method of regulating a load on a rechargeable solid-state battery having a charge gradient through a thickness of a layered cathode. The method includes providing a set of linear equations representing an equivalent circuit of a rechargeable solid-state battery, each equation of the set corresponding to either an individual layer of layers of an electrode or a cell stack of the layers, wherein an electrical behavior of each of the layers is represented by environment-dependent electrical components that model electron transport, ion transport, and particle dynamics, solving, using at least one computer processor operatively coupled with a memory, the set of equations for an electrical current or voltage in each layer, computing a state of charge (SOC) for each layer using the solved electrical current or voltage for the layer and using a previous SOC associated with the layer, combining the computed SOC for each layer to compute an aggregate SOC, receiving a temperature value from a temperature sensor within or proximate to the battery, updating an impedance value or an ideal voltage source in each layer based on the SOC for each layer and the temperature value from the temperature sensor, gauging, using a current sensor, a load current from the battery, calculating a loaded terminal voltage of the battery based on the updated impedance values, the ideal voltage sources, the computed SOCs, and the load current, and signaling a load device controller based on the computed aggregate SOC or calculated loaded terminal voltage.

The method can include measuring, using a voltage sensor, a loaded terminal voltage of the solid-state battery, generating an error signal that represents a difference between the calculated loaded terminal voltage and the measured loaded terminal voltage, and adjusting at least one layer's impedance value or ideal voltage source in order to minimize the error signal.

The method can include using the error signal for multiple purposes. First the error signal can be used in a 'fast' loop to update state variables such as state of charge estimates. Second, the error signal can be used to optimize the parameter results.

In some embodiments, the method can include measuring, using a voltage sensor, a loaded terminal voltage of the solid-state battery, generating an error signal that represents a difference between the calculated loaded terminal voltage and the measured loaded terminal voltage, and adjusting at least one model parameter or state, such as one layer's impedance value or ideal voltage source, in order to minimize the error signal.

In some embodiments, the method can include estimating a power limit from the battery based, in part, on the terminal voltage. Signaling of the load device controller can include transmitting the aggregate SOC, the calculated loaded terminal voltage, and/or the estimated power limit to the load device controller.

In some embodiments, the method can include switching a relay connected with a power source other than the battery, the switching based upon the estimated power limit or the computed aggregate SOC. It can include providing a power command to a power source. The power source other than the battery can include an internal combustion engine, fuel cell, or second battery. The rechargeable solid-state battery represented by the set of linear equations can have a conversion chemistry cathode, and the second battery can have a lithium iron phosphate chemistry cathode. The conversion chemistry cathode can include an iron fluoride cathode, a copper fluoride cathode, a nickel fluoride cathode, or a combination thereof. The rechargeable solid-state battery represented by the set of linear equations can have an intercalation chemistry cathode, and the second battery can have a lithium iron phosphate cathode. Other intercalation chemistry cathodes are contemplated by the instant disclosure, such as, but not limited to $LiCoO_2$, $LiNi_xCo_yMn_zO_2$, wherein $x+y+z=1$, $LiNi_xCo_yAl_zO_2$, nickel manganese cobalt oxides, nickel cobalt aluminum oxides, lithium titanate, combinations thereof, and the like.

The impedance value can be selected from the group consisting of a layer electron transport resistance, a particle electron transport resistance, a layer ion transport resistance, a particle ion transport resistance, ion exchange effects modeled by a particle resistance, and a particle capacitance. The impedance value in each layer can be calculated from a layer electron transport resistance, a particle electron transport resistance, a layer ion transport resistance, a particle ion transport resistance, ion exchange effects modeled by a particle resistance, and a particle capacitance. The impedance value in each layer can be modeled from a layer electron transport resistance, a particle electron transport resistance, a layer ion transport resistance, a particle ion transport resistance, ion exchange effects modeled by a particle resistance, and a particle capacitance.

The method can include powering down or powering on a vehicle accessory based upon the aggregate SOC or estimated power limit. The vehicle accessory can be selected from the group consisting of a cabin climate control system, an air conditioner, a heater, a seat warmer, an audio system, an auxiliary battery charger, a light, and a cigarette lighter outlet. The method can include turning on or off a battery heater based upon the measured temperature. The method can include limiting or reducing the power output to a vehicle accessory based upon the aggregate SOC or estimated power limit. The method can include limiting or reducing the power available for a vehicle accessory based upon the aggregate SOC or estimated power limit.

The method can include limiting or reducing the power available to a vehicle system, such as, but not limited to, a power train.

The aggregate SOC can be transmitted to a fuel gauge or range estimator. At least one processor and memory can be part of a battery management system (BMS). The solving, computing, updating, and calculating can be performed in real-time by the BMS.

The method can include updating the impedance value based on an environmental condition selected from the group consisting of the aggregate SOC, a direction of load current, a magnitude of load current, and an age of the battery. The method can include updating an ideal voltage source of each layer using the computed SOC for the layer and updating an impedance value of a cell stack based on an aggregate SOC of the battery and the temperature value from the sensor. The signaling can be analog or digital.

Yet other embodiments relate to systems executing the above-referenced methods and non-transitory machine-readable tangible storage media that employ or store instructions for the methods described above. The battery management system can include a battery cell coupled with the battery management system and/or an entire electric or hybrid automobile that includes the battery management system.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

BRIEF DESCRIPTION OF THE DRAWINGS

FIG. 5 illustrates ion and electron transport within layers of a cathode in accordance with an embodiment.

DETAILED DESCRIPTION

Figure 1:
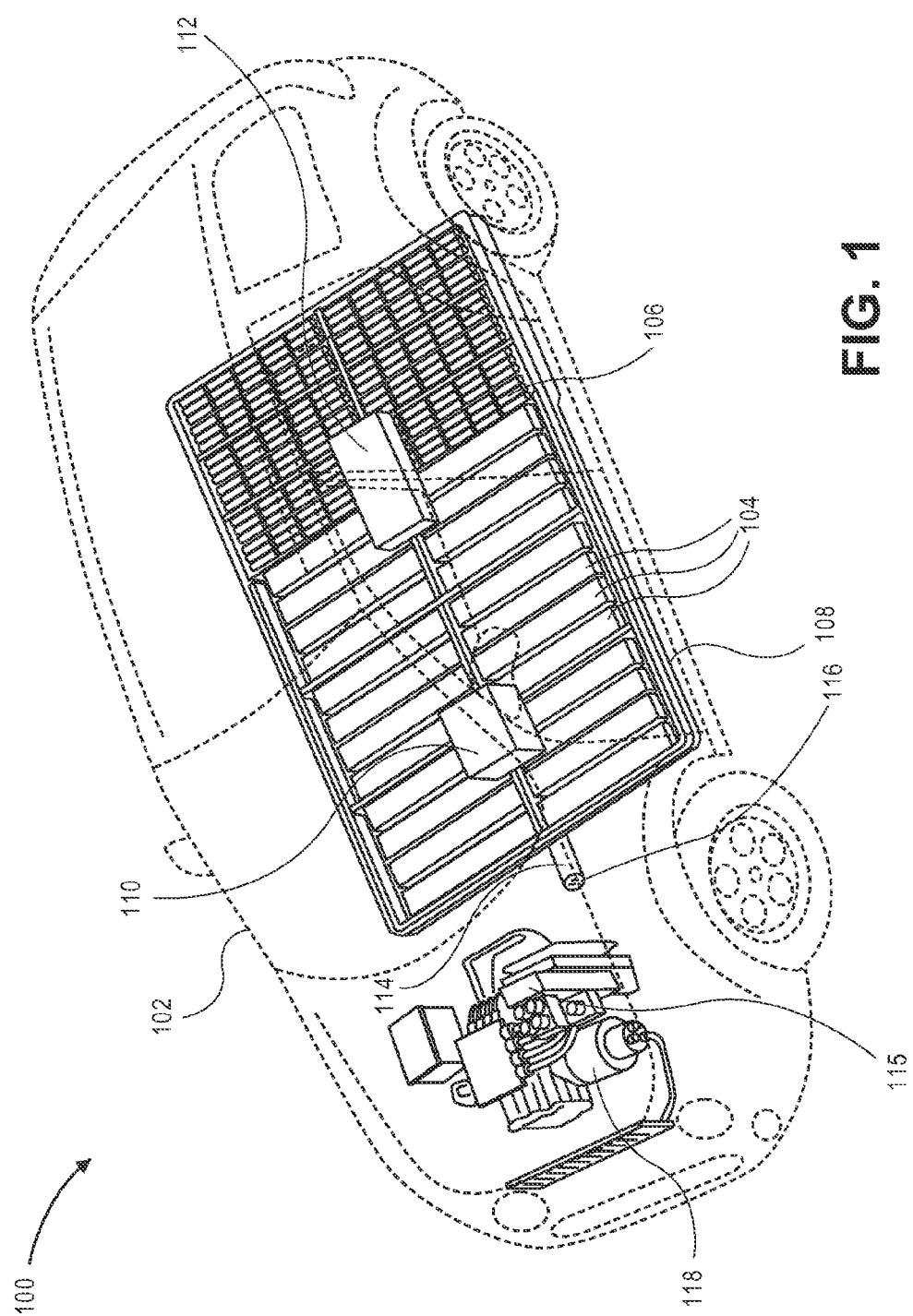
FIG. 1 illustrates an electric automobile with a battery management system in accordance with an embodiment.

The following description is presented to enable one of ordinary skill in the art to make and use the instant disclosure and to incorporate it in the context of particular applications. Various modifications, as well as a variety of uses in different applications, will be readily apparent to those skilled in the art, and the general principles defined herein may be applied to a wide range of embodiments. Thus, the present disclosure is not intended to be limited to the embodiments presented, but is to be accorded the widest scope consistent with the principles and novel features disclosed herein.

In the following detailed description, numerous specific details are set forth in order to provide a more thorough understanding of the embodiments described herein. However, it will be apparent to one skilled in the art that the present disclosure may be practiced without necessarily being limited to these specific details. In other instances, well-known structures and devices are shown in block diagram form, rather than in detail, in order to avoid obscuring the examples and embodiments detailed herein.

All the features disclosed in this specification, (including any accompanying claims, abstract, and drawings) may be replaced by alternative features serving the same, equivalent, or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. §112(f). In particular, the use of "step of" or "act of" in the Claims herein is not intended to invoke the provisions of 35 U.S.C. §112(f).

Please note, if used, the labels left, right, front, back, top, bottom, forward, reverse, clockwise, and counterclockwise have been used for convenience purposes only and are not intended to imply any particular fixed direction. Instead, they are used to reflect relative locations and/or directions between various portions of an object.

A "battery management system (BMS)" refers to the various components of the battery system, which can include a member selected from battery cells of various types, a computer coupled to a memory and processing unit, a sensor or analog measuring circuit to measure one or more voltages of battery cells or groups of battery cells, an analog to digital converter capable of translating sensor or voltage information to a digital format, a computer processor capable of performing mathematical and logical operations, a means of disconnection or controlling the battery systems output (i.e. relay, contactor, solid state switch), a communication network between the battery system and the load (i.e. an electric vehicle), a plurality of temperature sensors capable of measuring the temperature of the battery cells or groups of battery cells, or as otherwise known in the art.

"Calculating," "computing," "estimating," and "solving" include determining through automated algorithms, lookup tables, etc. a numerical result from one or more inputs, or as otherwise known in the art.

"Combining" includes summing or adding, with or without weightings, and with or without additional functions, multiple values to compute a result, or as otherwise known in the art. Combining can include multiplying values together or other functions or operations in lieu of additive operations.

"Updating" a value includes overwriting, revising in place, copying and changing, or otherwise modifying an existing value, or as otherwise known in the art.

"Operatively connected with" includes having a physical, hydraulic, pneumatic, analog or digital data, electrical, magnetic, thermal, or other connection that serves to facilitate the operation of an element in conjunction with another element, or as otherwise known in the art.

An "impedance" includes an electrically resistive and/or reactive impedance, or as otherwise known in the art.

An "anode" includes a negative electrode, or as otherwise known in the art.

A "cathode" includes a positive electrode, or as otherwise known in the art.

A "cell stack" includes an integrated collection of anodes and cathodes, separated by an electrolyte, that share housings or other containment vessels and output to a common terminal, or as otherwise known in the art.

A "load current" includes drawing electrical current from, or pushing current to, a power source, or as otherwise known in the art. For example a load current can include drawing current from a battery while discharging or pushing current to the battery while recharging the battery. Thus, both positive and negative currents are contemplated by the term "load current."

A "state of charge," as shown as the acronym "SOC," includes the extent to which a given battery cell or layer of a battery cell is charged or discharged, with respect to the charge capacity of the battery cell or layer of the battery cell at full charge, or as otherwise known in the art. For example, when a battery cell possesses half of the capacity of the battery cell at full charge, the battery has an SOC of 50%. A "previous SOC" includes a state of charge at an immediately prior or otherwise previous time interval.

A "charge gradient" includes an asymmetrical distribution of charge, or differing SOC for each layer, through the thickness of a layered cathode, or as otherwise known in the art.

There may be a charge gradient through a homogenous cathode material because more ions have settled near the electrolyte than near the current collector.

A "solid-state battery" includes an electrochemical-energy storage cell having an electrolyte in a non-liquid, non-gaseous state, or as otherwise known in the art. A solid state battery can comprise gel electrolytes as well as solid electrolytes.

"Providing memory for at least one equivalent circuit state" includes declaring a programming variable in a suitable programming language for storing a value corresponding to a circuit element in an equivalent circuit, or as otherwise known in the art.

An "environmental factor" includes temperature, humidity, pressure, electric field, magnetic field, salinity, acoustics, or other conditions in the environment, or as otherwise known in the art.

An "environment-dependent" component includes a part of a system that is operationally affected by an environmental factor, or as otherwise known in the art.

"Particle dynamics" includes the transportability, permeability, electromagnetic susceptibility, and other kinematic characteristics of small, typically nanometer-, micron-, or millimeter-sized particles, or as otherwise known in the art.

To "minimize an error signal" includes adjusting variables such that an error signal is reduced below previous values to a local or universal minimum, or as otherwise known in the art. To minimize can include lessening a value to a practical extent where there is no mathematically derivable minimum.

"Real time" includes operating to obtain a result within microseconds, milliseconds, seconds, minutes, or other time ranges that can result in actionable changes to a relevant system, or as otherwise known in the art.

"Signaling" includes transmitting an analog or digital signal, including those in a message on a digital bus, stopping the transmission of such a signal, or as otherwise known in the art.

Despite their advantages, solid state battery cells have drawbacks that have prevented their widespread use in batteries. One of them is the lower ionic conductivity of solid electrolytes compared with liquid electrolytes. Lower ionic and electronic conductivities can create larger local imbalances in state of charge throughout the depth of the electrode. A battery's dynamic power capability, terminal voltage and other performance characteristics depends therefore not only on aggregate states, but on local states as well.

To accurately predict the performance and determine the state of such a battery, an accurate model of these effects is preferred. For example, the short-term power capability of such a battery, which can be important to its use in an application such as an electric vehicle, depends not only on the absolute ion concentration in the electrodes, but also on the distribution of this concentration. In an electrode with limited ionic conductivity, charge carriers located closer to the separator are more readily accessible.

In certain cases, it may be advantageous to use different compositions of active material throughout the thickness of the electrode. In these cases the local differences in state of charge are more pronounced and the benefits of modeling an inhomogeneous charge distribution throughout the electrode are even greater.

In embodiments, power draw peculiarities in solid-state batteries are compensated for by using real-time, advanced computation techniques to control their loads. The advanced computation techniques include solving a set of linear equations in real-time that model electron transport, ion transport, and particle dynamics in virtual or physical layers of the battery cells' cathodes. The results are checked against actual measurements of loaded terminal voltages, and the parameters of the linear equations are adjusted in real-time. That is, the results are checked while an automobile or other vehicle is in motion. Sensors for temperature and current can also be input into the model to refine the results and/or formulate other variables of interest, such as aggregate state of charge (SOC) of individual cells up to an entire battery pack.

This modeling technique can permit the real-time evaluation of the state of charge, power capability and state of health of a solid-state battery with great accuracy. This accuracy allows for uses of solid state batteries that may not have been practical before.

Technical advantages of embodiments of examples and embodiments herein are many. Solid-state lithium batteries, which can have very high energy densities but sometimes have power output limitations, can be readily used in automobiles or other practical applications with some embodiments. Accurate estimated power limits can trigger other power sources, such as a hybrid car's internal combustion engine, to help power the car when the solid state batteries cannot provide electrical energy quickly enough. This can avoid undesirable driving scenarios in which not enough power can be drawn from a battery despite its terminal voltages initially appearing nominal. It can also avoid damage to a battery when too much load is applied to a battery whose ions cannot move quickly enough through the solid state electrolyte. States of charge can be better conveyed to the driver and/or battery management system of the vehicle, allowing for better estimates of range and mileage.

A model for a battery electrode can be created by dividing an electrode into a number of layers, each layer consisting of active material, electron conducting material, and ion conducting material. Each layer may comprise a unique composition of these elements, or it can be homogenous with other layers.

An equivalent circuit of each layer can be created using resistive, capacitive, and storage elements. Storage elements can include a state of charge state variable, an SOC-dependent voltage source, and a status of a hysteresis element. Each layer is connected to adjoining layers using resistive elements to model ion and electron transport. Bulk ohmic resistance and ion exchange external to the electrode can be represented using a Randles cell equivalent circuit.

Mesh equations are created from the equivalent circuit to generate a mathematical model. This model can be solved using a number of software techniques, including a finite difference approximation or an ordinary differential equation (ODE) solver.

The model can be combined with a state estimator such as an extended Kalman filter and implemented in a microcontroller along with appropriate sensors to estimate battery cell states in real-time.

FIG. 1 illustrates an electric automobile with a battery management system in accordance with an embodiment. Vehicle system 100 includes electric car 102 with transmission and electric motor 118 and power electronics 115. A range display, or "fuel gauge," may be displayed to a driver or passengers on a dashboard or shared display. Multi-cell battery pack 108 is located under the floor of the vehicle.

Battery pack 108 includes rechargeable solid-state battery cells 104. Battery pack 108 also includes power cells 106 that are of a different battery chemistry than solid-state battery cells 104. In some embodiments, power cells are optional elements and not necessary. In some examples, power cells can be substituted with additional battery cells, such as battery cells 104.

Solid-state battery cells 104 are shown in the figure as long rectangular blocks for line drawing reproducibility but are in actuality hundreds of small rectangular cells. Cells 104 have a conversion chemistry cathode. Conversion chemistry cathodes can include those using iron fluoride, copper fluoride, nickel fluoride, or other suitable conversion chemistry materials.

Power cells 106 have a lithium iron phosphate chemistry cathode. In alternative embodiments, solid-state battery cells 104 can have intercalation chemistry cathodes, and power cells 106 can have lithium iron phosphate cathodes. Other battery chemistries are envisioned and would be apparent to one of skill in the art. Power cells 106 may also include hybrid combinations of conversion chemistry and intercalation chemistry cathode active materials.

Battery pack 108 is connected to the rest of the vehicle through high-voltage electric cable 114. Solid-state battery cells 104 have a terminal voltage that can be measured at terminals 116 on cable 114 or in other suitable tap areas. Terminal voltages can be measured on individual cells as well as for the overall battery pack. The terminal voltage and/or other sensor inputs are input into battery management system (BMS) 110. BMS 110, in turn, controls at least the battery thermal management system 112 and may also control or modulate other load device controllers.

Figure 2:
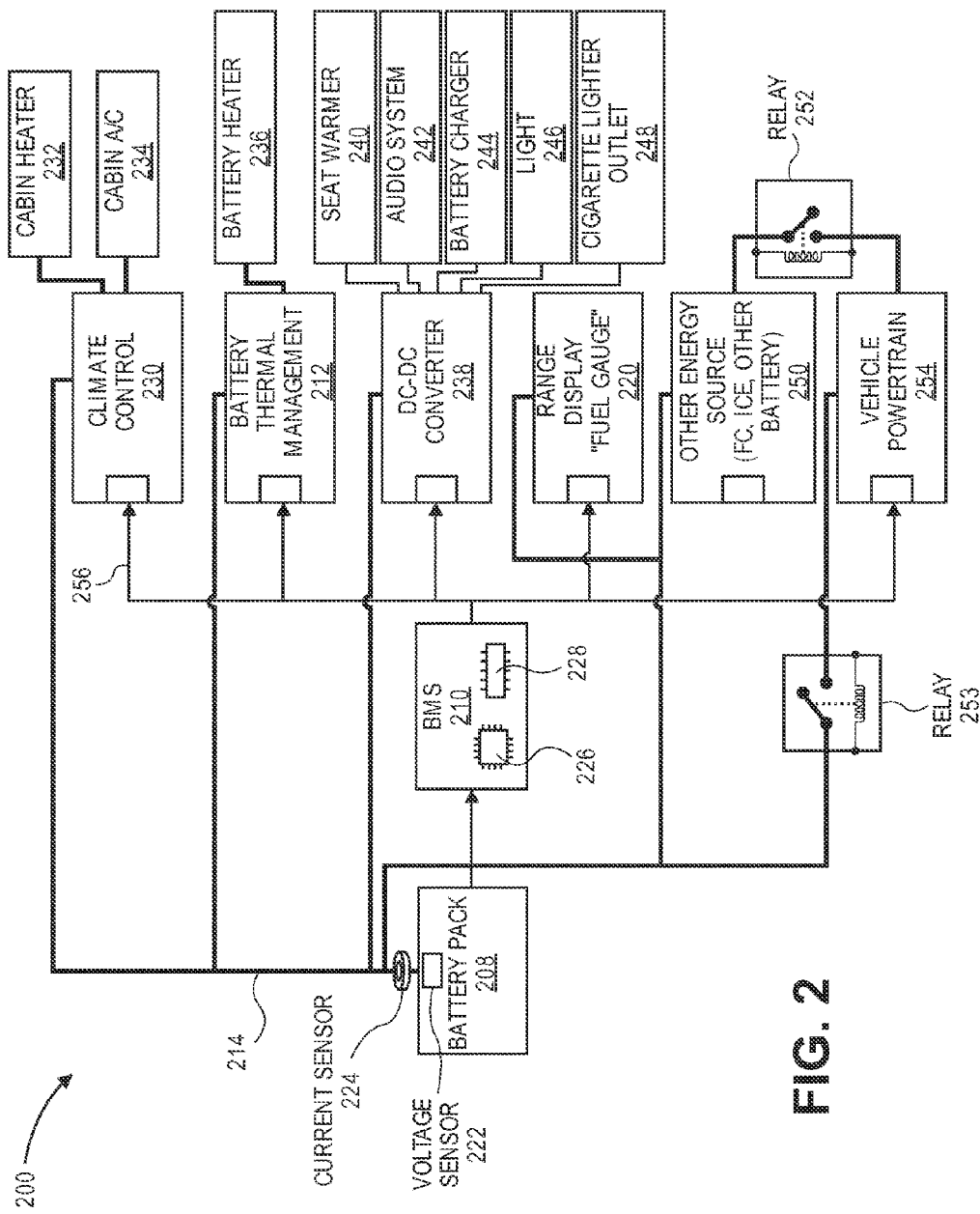
FIG. 2 is a simplified electrical system schematic of a hybrid automobile in accordance with an embodiment.

FIG. 2 is a simplified electrical system schematic of an automobile in accordance with an embodiment. In system 200, battery pack 208 is connected by high voltage lines 214. Terminal voltage sensor 222 measures the loaded voltage of battery pack 208 (or cells), while current sensor 224 gauges (i.e., measures) load current to and from battery pack 208. The voltage and current that are measured are from solid-state battery cells in battery pack 208. Outputs from voltage sensor 222 and current sensor 224 are sent to battery management system (BMS) 210.

In some embodiments, element 208 represents a battery cell or a collection of battery cells. In some embodiments, sensor 222 measures the loaded voltage of a single battery cell, a collection of battery cells, or a battery pack comprising battery cells.

BMS 210 includes microprocessor 226 and memory 228. Memory 228 is operatively connected via a high speed bus to processor 226 so that its memory can be addressed by computing elements in processor 226. Other peripheral systems, such as a processing acceleration unit, an I/O subsystem, a storage subsystem, and a communications subsystem can be connected as well to processor 226. A storage subsystem can include tangible, non-transitory computer-readable storage media and a system memory.

Processor 226, which can be implemented as one or more integrated circuits, such as a conventional microprocessor or microcontroller, controls the operation of battery management computer system 210. One or more processors may be included in processing unit 226. These processors may include single core or multicore processors. In certain embodiments, processor 226 can be implemented as one or more independent processing units with single or multicore processors included in each processing unit. In other embodiments, the processor can also be implemented as a quad-core processing unit formed by integrating two dual-core processors into a single chip.

Processor 226 can execute different programs in response to program code and, in some configurations, can maintain multiple concurrently executing programs or processes. At any given time, some or all of the program code to be executed can be resident in processor 226 and/or in memory 228.

Battery management system 210 communicates with various load device controllers through communication line 256. A signal can be sent, or stopped from being sent, to one or more load device controllers, such as those for climate control system 230, battery thermal management system 212, direct current (DC)-to-DC converter 238, other power or energy sources 250, and/or vehicle powertrain 254.

Climate control system 230 includes cabin heater 232 and cabin air conditioner (A/C) 234. It can be signaled by battery management system 210 to temporarily cease, for example, an air conditioning compressor. Battery thermal management system 212 can be signaled to turn on battery heater 236 so that the cells in battery pack 208 come to a more optimal battery temperature. It can also signal to cool the cells in battery pack with a refrigerant, solid-state piezoelectric cooling, etc. DC-DC converter 238 can be signaled to remove or add power to seat warmer 240, audio system 242, auxiliary battery charger 244, cabin light, running light, fog light, or headlight 246, and/or cigarette lighter outlet 248. Range display 220 can be updated as well.

In some embodiments, the battery cells are actively heated. In other embodiments, the battery cells are actively cooled. In some embodiments, the battery cells can be both actively heated and actively cooled. In some embodiments, a battery management system, such as BMS 210, can temporarily cease, turn on, modulate, or limit the heating or cooling systems that are in thermal contact with the battery cells.

If a large burst of power is required, an alternative power source 250, such as a fuel cell (FC), internal combustion engine (ICE), or auxiliary battery can be placed into service. Relay 252 or 253 can connect alternative power source 250 to vehicle drivetrain 254. Power can be shunted to the rest of the vehicle by high voltage line 214. Vehicle drivetrain 254 may be signaled to preserve power by shifting to a lower or higher gear, adjusting speed, or other measures.

Figure 3:
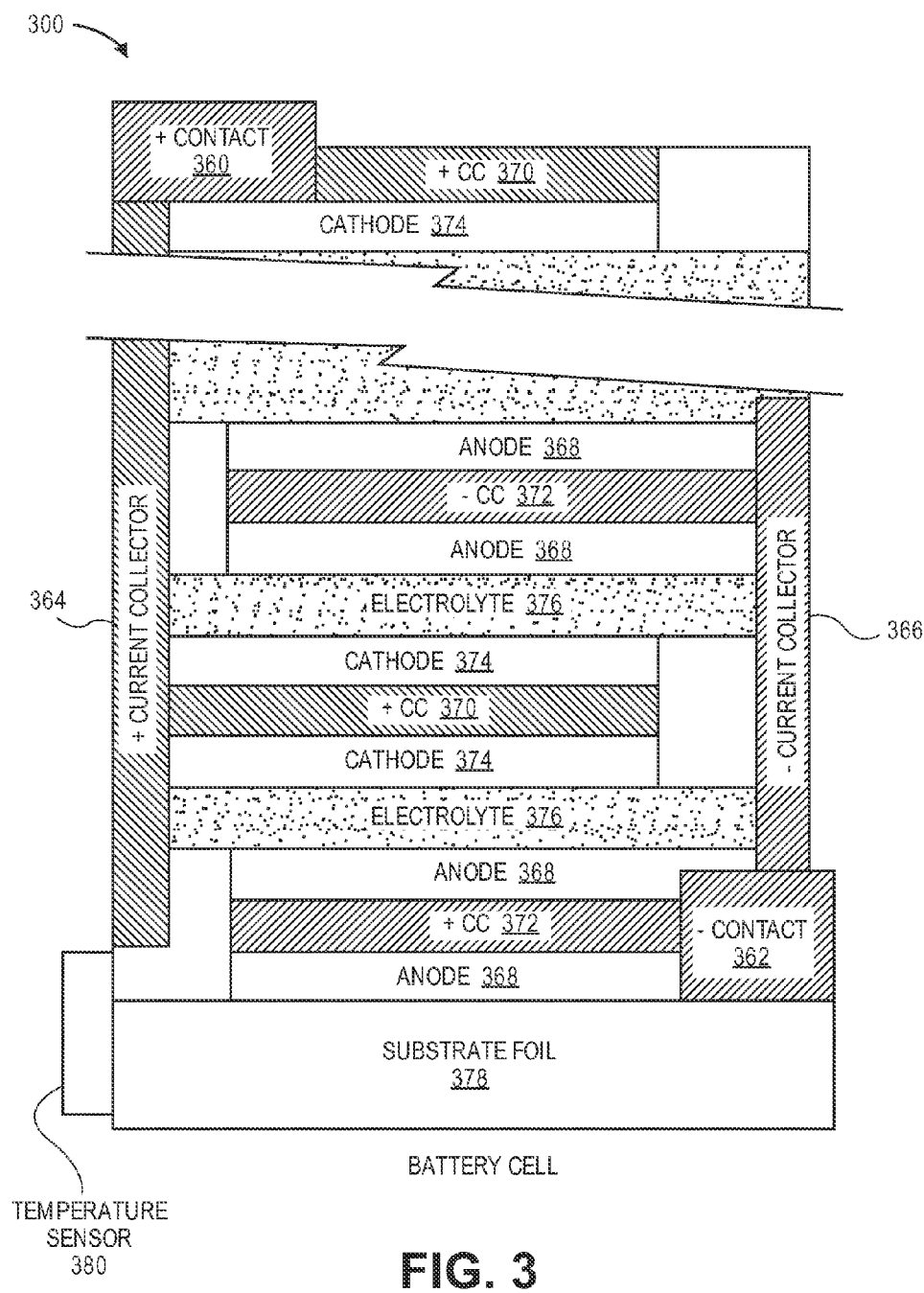
FIG. 3 illustrates a cross section of a battery cell in accordance with an embodiment.

FIG. 3 illustrates a cross section of a multi-stack battery cell in accordance with an embodiment. While the figure shows only two sets of anodes 368 and two sets of cathodes 374, the concept is readily extendible to designs having more, and often many anodes and cathodes, for example 100 layers of anode/electrolyte/cathode, each layer on the order of 50-150 nm thick.

Anodes 368, cathodes 374, and electrolyte 376 can have compositions, properties, and/or morphologies, such as those described in U.S. Patent Application Publication No. 2014/0170493 A1 to Holme, published Jun. 19, 2014, or as otherwise known in the art.

There is a current collector disposed between two layers of active material in each electrode. These current collectors (370 and 372) are horizontally oriented in the depicted embodiment. These individual electrode current collectors are electrically connected to a bus or vertical current collector (364 and 366) as depicted in the figure. Vertical current collectors 364 and 366 are connected with positive contact 360 and negative contact 362, respectively. Solid electrolyte 376 not only separates adjacent anodes and cathodes.

An approximately 10 μm thick substrate foil 378 is maintained at the bottom of the cell. Temperature sensor 380 is placed adjacent to the cell for determining the temperature of the cell. Temperature sensor 380, which can include a simple thermocouple or thermistor, sends its signal to battery management system 210 (see FIG. 2) for further processing.

In various embodiments, the cell is provided with a battery maintenance or battery controller apparatus such as a battery charger and associated circuitry for controlling discharge and/or charge parameters such as cut off voltages, cut off capacities, current, temperature, and the like.

FIGS. 4A-4D illustrate examples of particle and nanodomain structures that may be employed in ferric fluoride and related conversion materials in an embodiment.

Figure 4A:
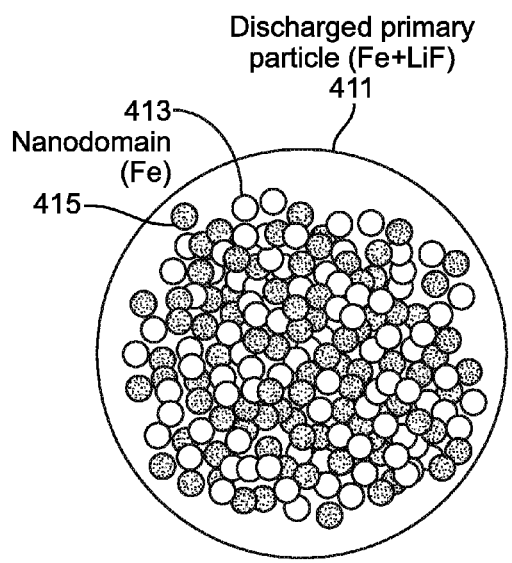
FIG. 4A illustrates a primary particle of a discharged cathode in accordance with an embodiment.

In FIG. 4A, primary particle 411 may be found in a discharged cathode. Primary particle 411 includes discrete nanodomains of iron metal 413 and lithium fluoride 415. Often, a primary particle has a characteristic cross-sectional dimension of about 100 nm or less. The nanodomains that make up a primary particle have cross-sectional dimensions of about 20 nm or less (e.g., about 5 nm or less). In some cases, the nanodomains are compositionally homogeneous.

Figure 4B:
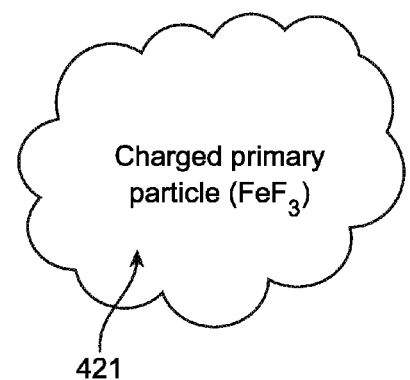
FIG. 4B illustrates a primary particle of a charged cathode in accordance with an embodiment.

In FIG. 4B, primary particle 421 is part of a fully charged ferric fluoride conversion material. Other conversion materials may be substituted for ferric fluoride and its discharge products in the structures presented.

Figure 4C:
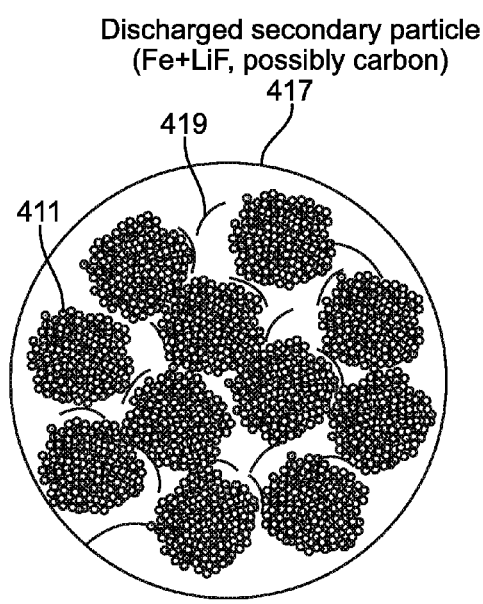
FIG. 4C illustrates a secondary particle, made up of primary particles, of a discharged cathode in accordance with an embodiment.

In FIG. 4C, secondary particle 417 (not drawn to scale) of discharged ferric fluoride conversion material is shown. Secondary particles are made up of primary particles 411, such as those presented in the figure, and possibly particles of an ionically conductive material and/or electronically conductive material 419. Secondary particles may be agglomerates or clumps of primary particles and optionally particles of ionically/electronically conductive materials. In some implementations, secondary particles are present in a slurry used to coat a positive current collector when forming the cathode. In certain embodiments, secondary particles have a cross-sectional dimension of about 0.1 to 5 micrometers. The dimensions presented are median values.

Figure 4D:
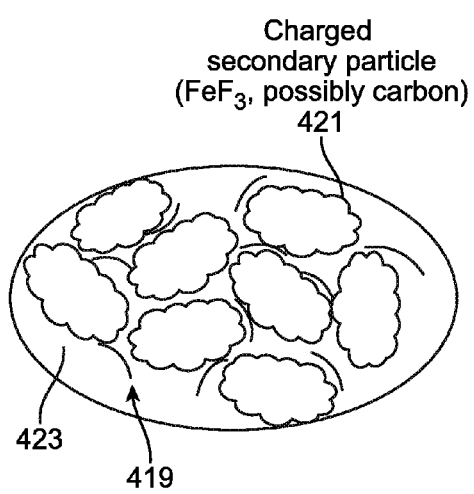
FIG. 4D illustrates a secondary particle, made up of primary particles, of a charged cathode in accordance with an embodiment.

FIG. 4D illustrates secondary particle 423, which consists of primary particles 421, of a fully charged ferric fluoride conversion material.

It is to be appreciated that while FIGS. 4A-4D illustrate LiF and Metal-F material, other types of materials are possible as well. For example, lithium fluoride may be substituted by a lithium fluoride and lithium sulfide combination. In such examples, the metal fluoride may be substituted by a metal fluoride/sulfide combination.

FIG. 5 illustrates ion and electron transport within layers of a cathode in accordance with an embodiment. System 500 is oriented such that electrolyte 576 is on the top, cathode 574 is in the middle, and current collector 570 is on the bottom.

During discharge operations, ions move down from anode (not shown) through electrolyte 576 into layers 582 of cathode 574. Electrons move up from current collector 570 into layers 582. The ions are not infinitely mobile through the cathode; therefore, the topmost layers accumulate the most positive charge. Electrons are much more mobile and move quickly to balance the charges in whatever layer 582 the ions settle. The relative mobility of ions and electrons can change. The transport of one or more charged species is limited, and this affects battery operation at the system scale.

The limited mobility of ions within the solid-state electrolyte and conversion chemistry cathode can be modeled using ideal circuit elements.

Figure 6:
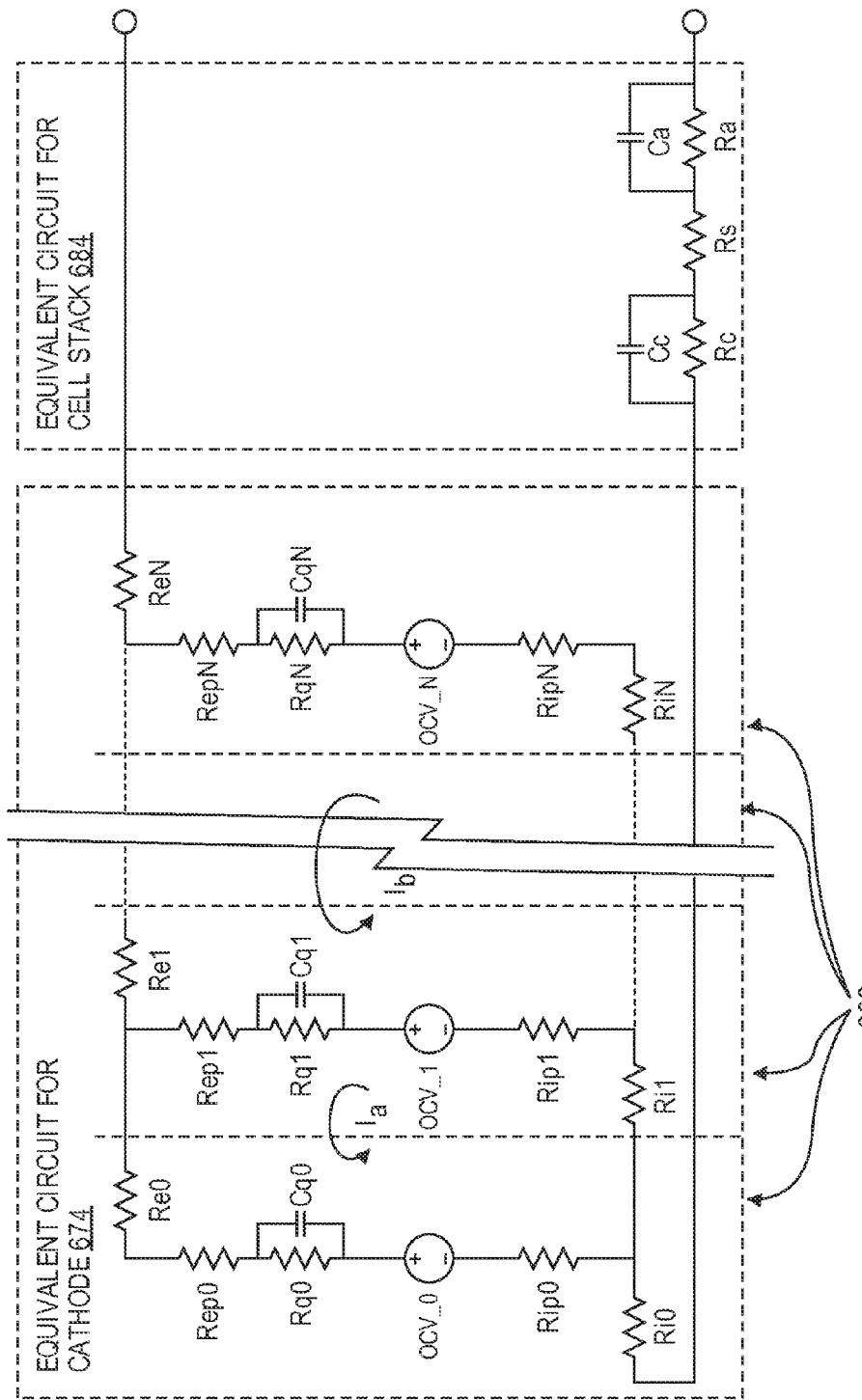
FIG. 6 illustrates an equivalent circuit of a cathode with layers in accordance with an embodiment.

FIG. 6 illustrates an equivalent circuit of a cathode with layers in accordance with an embodiment. A cathode is modeled using equivalent circuit 674 with multiple single layer models connected by inter-layer ionic and electronic resistances. Each single layer model includes particle electronic resistance, an ion exchange model, state of charge as an open circuit voltage source, and/or particle ionic resistance. Battery terminals are shown on the right side of the figure.

Each layer 682 of cathode 674 includes the following parameters, including mixed electron-ion conducting components (MEIC):
Re a layer electron transport resistance
Rep a particle electron transport resistance (MEIC)
Ri a layer ion transport resistance
Rip a particle ion transport resistance (MEIC)
Rq a particle resistance
Cq a particle capacitance
OCV an open circuit voltage Each single layer model, which includes an Rep, Rq, Cq, OCV, and Rip, is connected with an adjacent layer using an Ri and/or an Re.

Equivalent circuit for cell stack 684 is closest to the battery load terminals and is modeled using the following parameters:
Ra an anolyte resistance
Ca an anolyte capacitance
Rc a catholyte resistance
Cc a catholyte capacitance
Rs a stack resistance Sometimes, a stack resistance is referred to as "charge transfer resistance" or "double layer capacitance." Sometimes, anolyte resistance/capacitance can be referred to as "anode-electrolyte interface resistance/capacitance." Sometimes, catholyte resistance/capacitance can be referred to as "catholyte-electrolyte interface resistance/capacitance."

Each electrical component shown can change values over time depending on environmental factors. For example, electrical resistance can increase with decreasing temperature. The open circuit voltage sources can also change depending on the charge stored in its respective layer. All of the components can be affected by age of the battery, number of cycles it has undergone, and current direction (i.e., whether the current is in the charge or discharge direction). For example, components can change values depending on whether the cell is brand new, six months old, or twelve years old.

A set of equations describes, models, or otherwise represents the equivalent circuit in the figure. These equations can be derived from Kirchhoff's Laws, Ohms Law, and other electrical equations.

Kirchhoff's Second Law concerning loops in electrical circuits can be readily applied by noting that there are multiple loops in the circuit diagram. Kirchhoff's Second Law is sometimes referred to as Kirchhoff's loop, mesh, or second rule. A loop is formed by adjacent layers' circuits. For example, starting at the upper right, a loop is formed by current going counterclockwise through the leftmost layer's Re0, Rep0, Rq0 and Cq0, OCV_0, Rip0 and then through the second-to-leftmost layer's Ri1, Rip1, OCV_1, Rq1 and Cq1, and Rep1. Note that the start and end points of the loop are the same and should therefore be at the same voltage.

In the exemplary embodiment, all mesh currents are assigned the same direction: counterclockwise (i.e., flowing into each layer). The voltage drop across each parallel RC (resistor-capacitor) circuit at a given time t is determined with the following discrete equation:

$$V_{rc}(t) = V_{rc}(t - \Delta t) + \frac{\Delta t}{C} I - \frac{\Delta t \cdot V_{rc}(t - \Delta t)}{C \cdot R}$$

An equation for the mesh furthest from the terminals (i.e., on the left side of the figure) is:

$$I_a \left( R_{ip0} + R_{ep0} + R_{ip1} + R_{ep1} + R_{e0} + R_{i1} + \frac{\Delta t}{C_{q0}} + \frac{\Delta t}{C_{q1}} \right) +$$

-continued $$I_b\left(-R_{ep1} - R_{ip1} - \frac{\Delta t}{C_{q1}}\right) = V_1 - V_0 - V_{rc0} + \left(\frac{\Delta t}{C_{q0}} \cdot \frac{V_{rc0}}{R_{q0}}\right)$$

An equation for the intermediate meshes (m) (i.e., in the middle of the figure) is:

$$I_{m-1}\left(-R_{epm} - R_{ipm} - \frac{\Delta t}{C_{qm}}\right) +$$

$$I_m\left(R_{ipm} + R_{epm} + R_{em} + R_{im+1} + R_{epm+1} + R_{ipm+1} + \frac{\Delta t}{C_{qm}} + \frac{\Delta t}{C_{qm+1}}\right) +$$

$$I_{m+1}\left(-R_{eqm+1} - R_{ipm+1} - \frac{\Delta t}{C_{qm+1}}\right)$$

An equation for the mesh closest to the load (n) (i.e., at the right of the figure) is:

$$I_n = I_{load}$$

When the set of mesh equations is solved, it results in a set of n mesh currents ($I_n$). The mesh currents can be translated into cathode layer currents as follows:

Current flowing into Layer $0 = I_0$

Current flowing into Layer $n = I_n - I_{n-1}$

These layer currents are used to update the SOC of each layer, which in turn updates the layer's open circuit voltage (OCV).

$$SOC(t) = SOC(t - \Delta t) + \frac{I \cdot \Delta t}{C}$$

Once the current flowing into the layer closest to the load is known, it may be used to determine the overall terminal voltage. The terminal voltage is the sum of:

1. The OCV of the layer closest to the load ($V_n$, or OCV_N in the figure); and
2. The voltage drop across all impedances between the voltage source and the terminals.

A power limit from the battery can be estimated by using the terminal voltage, impedance values, ideal voltage sources, SOCs for each layer, load current, and a maximum and minimum allowable voltage for the battery cell or for individual layers. An aggregate SOC for the entire cell can be calculated based on the SOCs for each individual layer. For example, the aggregate SOC can be a weighted average of the SOCs of all 1 through n layers.

Figure 7:
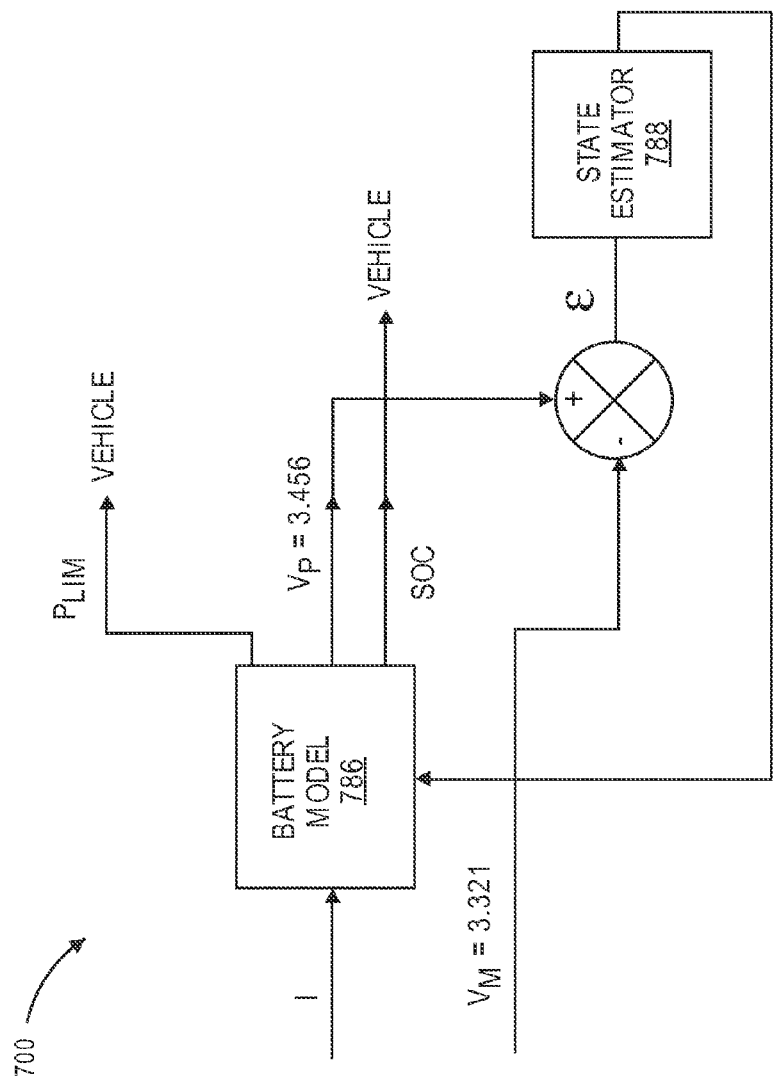
FIG. 7 is a block diagram with a feedback loop in accordance with an embodiment.

FIG. 7 is a block diagram with a feedback loop in accordance with an embodiment. In system 700, load current I is input into battery model 786, which includes multiple mesh equations like those described above. After the mesh equations of battery model 786 are solved, several outputs are given.

The current for each layer is used to update the state of charge for the respective layer. The states of charge of the layers are then summed or otherwise combined together to produce an aggregate state of charge of the cell (and battery). This state of charge may be sent to the vehicle to be displayed to a driver or to be used for automatically switching on or off or otherwise controlling equipment.

Power limits are calculated based upon the calculated loaded terminal voltage (discussed below), impedance values, ideal voltage sources, SOCs for the layers, load current, and allowable voltage limits for the battery cell or for individual layers. The power limits may be sent to the vehicle to be displayed to the driver or used for automatically switching on or off or otherwise controlling equipment.

In some embodiments, the aggregate SOC and power limits are communicated to the power train to limit or modulate the power consumed by the power train.

If the aggregate SOC or power limit is not high enough, the vehicle may limit the power consumed by the power train. Separately or in conjunction with limiting power to the power train, certain load devices can be powered down to conserve power. For example an air conditioner's compressor can be temporarily turned off in order to preserve power. Many non-essential vehicle accessories can be powered down, such as a climate control system, heater, seat warmer, window defrosters, audio systems, auxiliary battery chargers, lights, cigarette lighter outlets, etc. Alternatively or in conjunction, auxiliary power sources can be brought online. For example, in a hybrid car an internal combustion engine (e.g., a gasoline, diesel, natural gas, propane, biofuel, and/or hydrogen fueled engine utilizing a combustion chamber, such as a piston, wankel, axial or rotary turbine engine) can be started or brought from a standby state to an active state. In other embodiments, a fuel cell or other battery can be tapped to fill in for the low charge of the battery. In order to connect the high-voltage elements of an auxiliary power source to the car, one or more mechanical or solid state relays may be switched. Conversely if the SOC is high enough (e.g., above a predetermined threshold value), then components can be switched back on and power sources can be switched off or put back in standby.

In cold climates, a battery heater may be switched on in order to bring the battery elements up to operating temperature if there is not enough available power.

A solid state battery with an iron fluoride, copper fluoride, nickel fluoride, or intercalation chemistry cathode can be suitably paired with a second battery with a lithium iron phosphate chemistry cathode. An advantage of this pairing is that a power limits of the high-power-density intercalation chemistry cathode battery can be compensated for using the second battery.

Referring back to FIG. 7, a loaded terminal voltage is calculated and compared with a measured terminal voltage from the batteries. Error $\epsilon$ is calculated by subtracting the measured voltage from the calculated voltage or the calculated voltage from the measured voltage. For example, the measured voltage may be 3.321 volts and the predicted voltage by computation is 3.456 volts, for an error of 0.135 volts.

Error $\epsilon$ is sent through state estimator 788, which may include a Kalman filter or other state estimator, and the output of state estimator 788 is fed back to battery model 786. Parameters may be changed in order to reduce or minimize error $\epsilon$.

Figure 8:
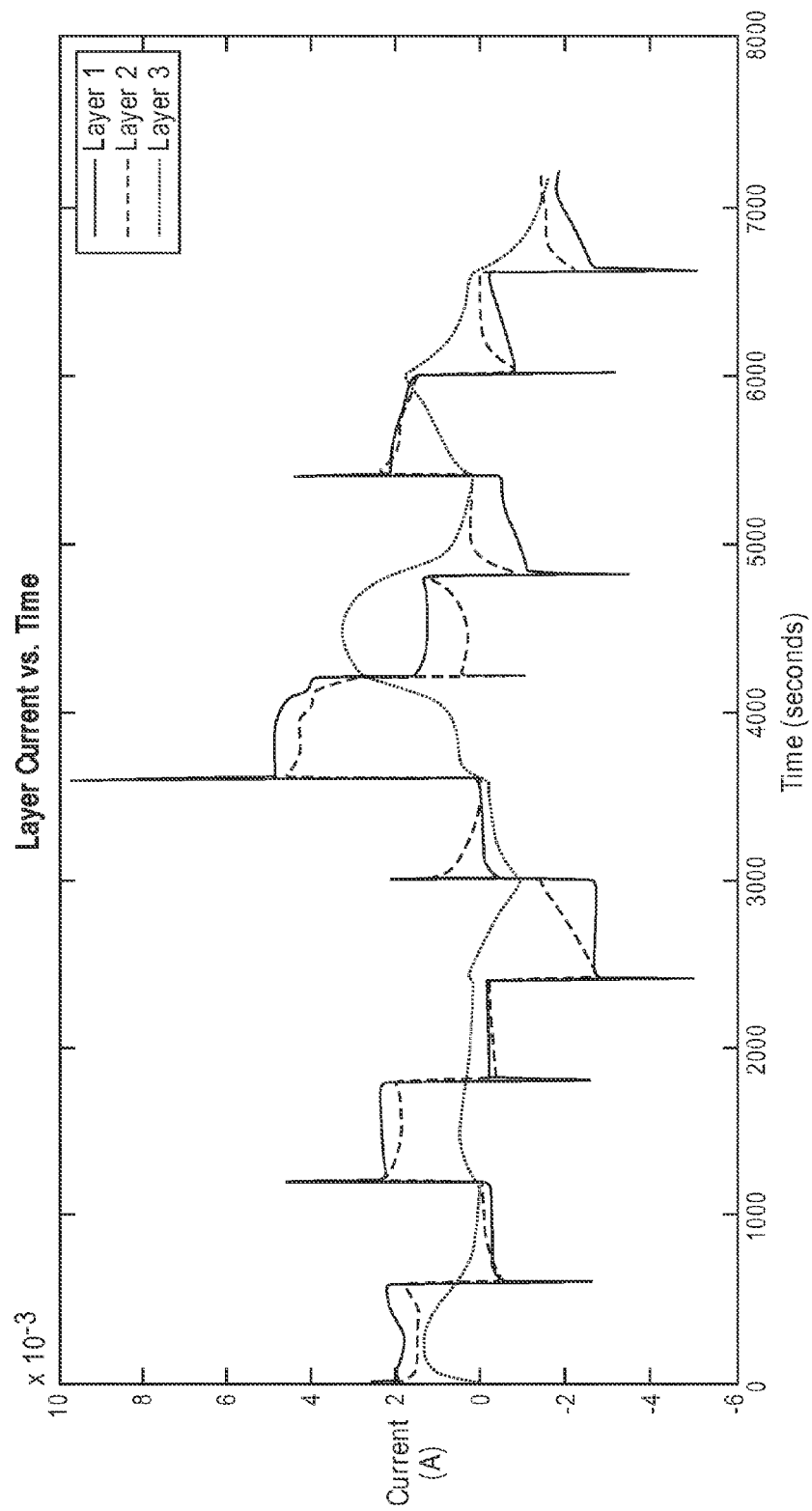
FIG. 8 is a current versus time chart, breaking out the currents for each layer, calculated in accordance with an embodiment.
Figure 9:
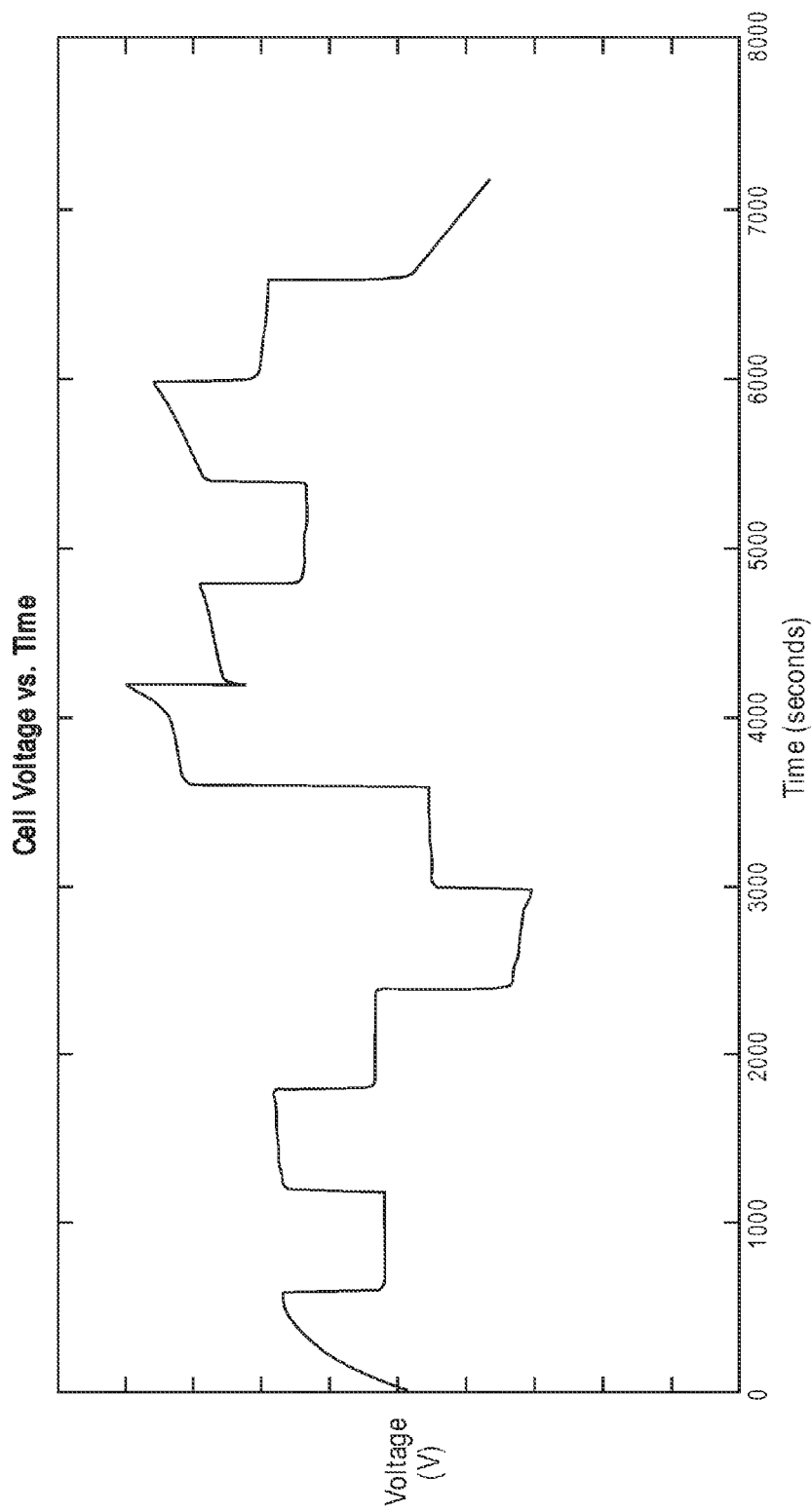
FIG. 9 is a cell voltage versus time chart calculated in accordance with an embodiment.
Figure 10:
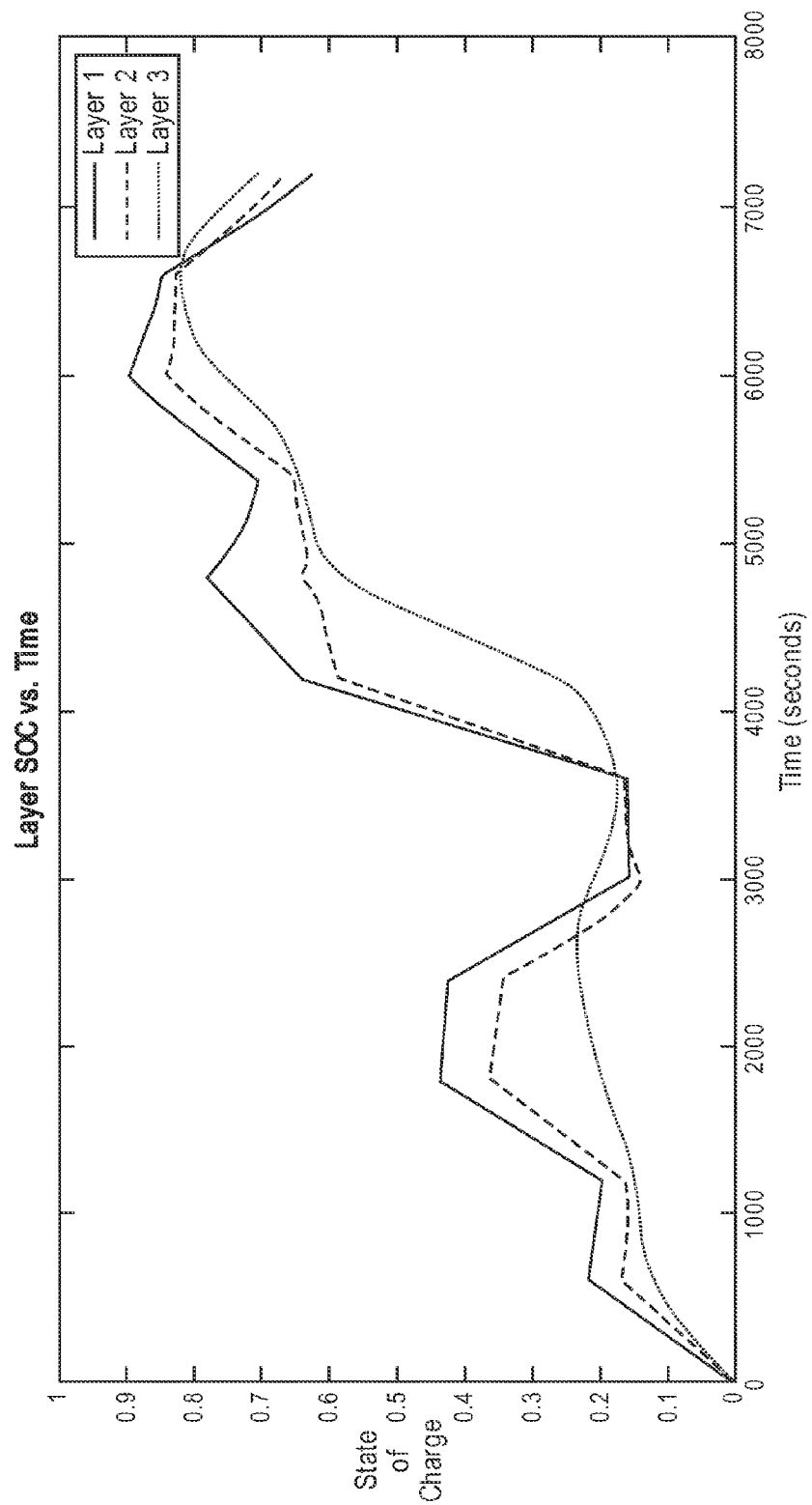
FIG. 10 is a state of charge (SOC) versus time chart, breaking out the SOC for each layer, calculated in accordance with an embodiment.

FIGS. 8-10 are plots of calculated parameters in a simulated battery cell. The cathode of the cell is modeled with three layers: layer 1, layer 2, and layer 3. Layer 1 is closest to the electrolyte while layer 3 is farthest from the electrolyte and closes to the current collector.

To stimulate the system in the simulation, square pulse current loads were applied over the course of about two hours (i.e., 7200 seconds). That is, a load current is drawn (or input to simulate recharging) at a constant rate for a fixed amount of time, and then dropped back to zero.

FIG. 8 shows a current versus time chart for each layer. Current is not evenly distributed throughout the layers, and that distribution may change over time.

An advantage using this method for solid state batteries is related to the fact that ion transport in the cathode is expected to be more limited than in liquid electrolyte batteries. It is expected that ion distribution will vary along the thickness of the cathode; therefore, local states of charge will have less tendency to equalize due to the flat conversion plateau voltage. An advantage of the instant method is the ability to predict charge imbalances that are more likely to occur due to the flat conversion plateau voltage.

The current for each layer is calculated using a loop equation for electrical current, commonly known as Kirchhoff's Second Law. Because there are multiple layers, there are multiple current loops in the equivalent circuit that have some dependencies on one another. The loop equations are solved simultaneously, mathematically speaking, using a linear system of equations. The result is a set of currents with respect to time, one current for each layer.

FIG. 9 is a cell voltage versus time chart calculated in accordance with an embodiment. The loaded terminal voltage is calculated after the equation impedances and ideal voltages have been updated, if any have been updated. The loaded terminal voltage is calculated using the impedance values, the ideal voltage sources, the computed SOCs, and the given load current.

FIG. 10 is a layer state of charge (SOC) versus time chart calculated in accordance with an embodiment. The SOC for each layer is computed using the respective layer's SOC at a previous time step adjusted by the electrical current for the respective layer.

Figure 11:
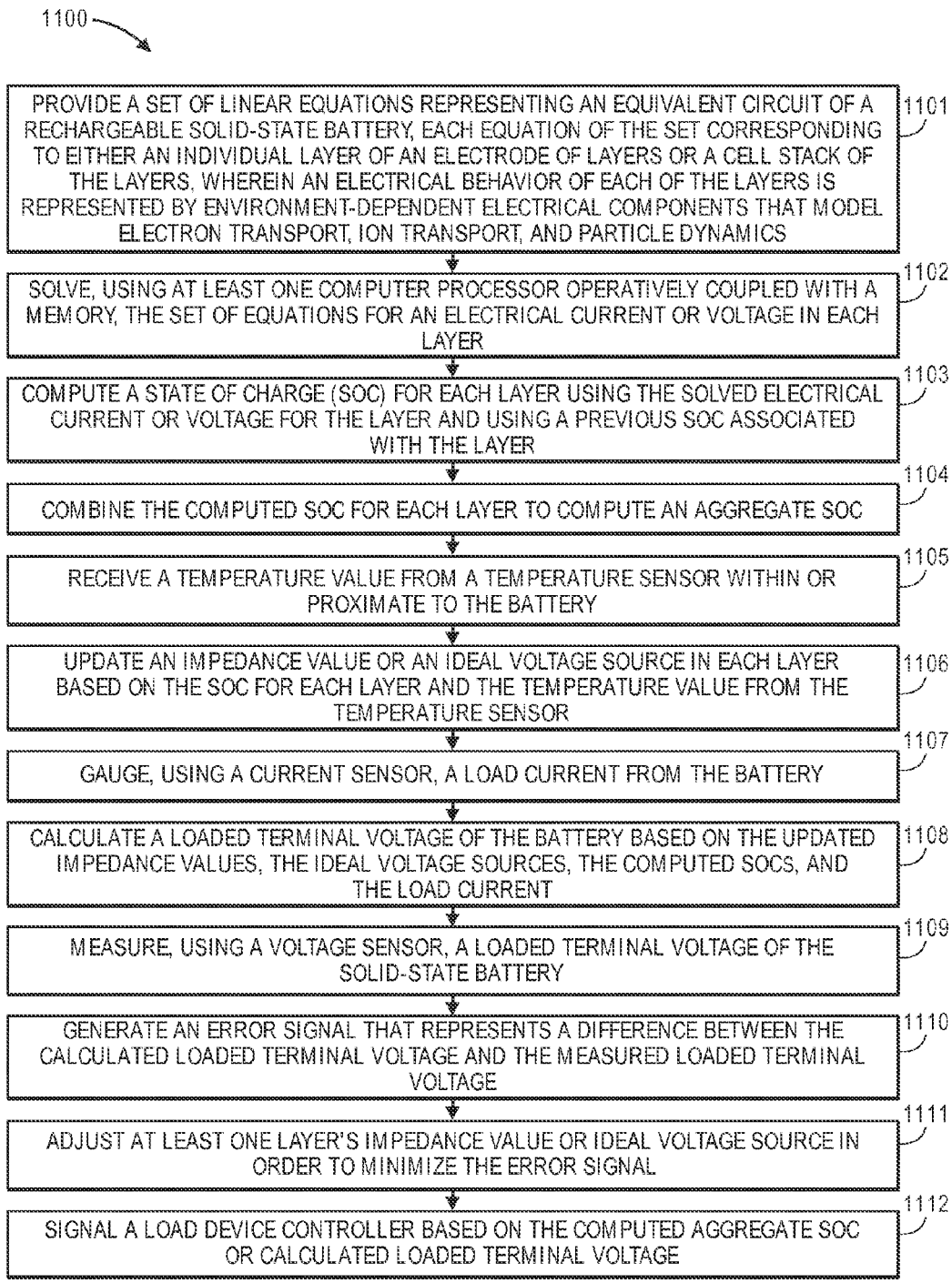
FIG. 11 is a flowchart illustrating a process in accordance with an embodiment.

FIG. 11 is a flowchart illustrating a process in accordance with an embodiment. System 1100 can be implemented in one or multiple computers. For example, a battery management system (BMS) computer with embedded software or firmware can execute many of the described operations. In operation 1101, a set of linear equations representing an equivalent circuit of a rechargeable solid-state battery are provided, each equation of the set corresponding to either an individual layer of an electrode of layers or a cell stack of the layers, wherein an electrical behavior of each of the layers is represented by environment-dependent electrical components that model electron transport, ion transport, and/or particle dynamics. In operation 1102, the set of equations is solved for an electrical current or voltage in each layer using at least one computer processor operatively coupled with a memory. In operation 1103, a state of charge (SO) for each layer is computed using the solved electrical current or voltage for the respective layer and using a previous SOC associated with the respective layer. In operation 1104, the computed SOCs the layers are combined to compute an aggregate SOC.

In operation 1105, a temperature value is received from a temperature sensor within or proximate to the battery. In operation 1106, an impedance value or an ideal voltage source in each layer is updated based on the SOC for each layer and the temperature value from the temperature sensor. In operation 1107, a load current from (including from and to) the battery is measured/gauged using a current sensor. In operation 1108, a loaded terminal voltage of the battery is calculated based on one or more of the updated impedance values, the ideal voltage sources, the computed SOCs, and/or the load current. In operation 1109, a loaded terminal voltage of the solid-state battery is measured using a voltage sensor. In operation 1110, an error signal that represents a difference between the calculated loaded terminal voltage and the measured loaded terminal voltage is generated or otherwise computed. In operation 1111, at least one layer's impedance value or ideal voltage source is adjusted in order to minimize or otherwise lessen the error signal. In operation 1112, a load device controller is signaled based on the computed aggregate SOC or calculated loaded terminal voltage.

While the above is a full description of the specific embodiments, various modifications, alternative constructions and equivalents may be used. Therefore, the above description and illustrations should not be taken as limiting the scope set forth by the following claims.

What is claimed is:

1. A method of regulating a load on a rechargeable solid-state battery having a charge gradient through a thickness of a layered cathode, the method comprising:
providing a set of linear equations representing an equivalent circuit of a rechargeable solid-state battery, each equation of the set corresponding to either an individual layer of layers of an electrode or a cell stack of the layers;
solving, using at least one computer processor operatively coupled with a memory, the set of equations for an electrical current or voltage in each layer;
computing a state of charge (SOC) for each layer using the solved electrical current or voltage for the layer and using a previous SOC associated with the layer;
combining the computed SOC for each layer to compute an aggregate SOC;
receiving a temperature value from a temperature sensor within or proximate to the battery;
updating an impedance value or an ideal voltage source in each layer based on the SOC for each layer and the temperature value from the temperature sensor;
gauging, using a current sensor, a load current from the battery;
calculating a loaded terminal voltage of the battery based on the updated impedance values, the ideal voltage sources, the computed SOCs, and the load current; and
signaling a load device controller based on the computed aggregate SOC or calculated loaded terminal voltage.

2. The method of claim 1 further comprising:
measuring, using a voltage sensor, a loaded terminal voltage of the solid-state battery;
generating an error signal that represents a difference between the calculated loaded terminal voltage and the measured loaded terminal voltage; and
adjusting at least one layer's impedance value or ideal voltage source in order to minimize the error signal.

3. The method of claim 1 further comprising:
estimating a power limit from the battery based on the terminal voltage.

4. The method of claim 3 further comprising:
powering down, powering on, modulating power for, or limiting power available to or consumed by a vehicle system or a vehicle accessory based upon the aggregate SOC or the estimated power limit.

5. The method of claim 4 wherein the vehicle accessory is selected from the group consisting of an electrical power train, a cabin climate control system, an air conditioner, a heater, a seat warmer, an audio system, an auxiliary battery charger, a light, and a cigarette lighter outlet.

6. The method of claim 3 wherein the signaling of the load device controller includes transmitting the aggregate SOC, the calculated loaded terminal voltage, or the estimated power limit to the load device controller.

7. The method of claim 3 further comprising:
switching a relay connected with a power source other than the battery, the switching based upon the estimated power limit or the computed aggregate SOC.

8. The method of claim 7 wherein the power source other than the battery comprises an internal combustion engine or fuel cell.

9. The method of claim 7 wherein the power source other than the battery comprises a second battery.

10. The method of claim 9 wherein the rechargeable solid-state battery represented by the set of linear equations has a conversion chemistry cathode.

11. The method of claim 9 wherein the second battery has a lithium iron phosphate chemistry cathode.

12. The method of claim 10 wherein the conversion chemistry cathode includes an iron fluoride cathode, a copper fluoride cathode, or a nickel fluoride cathode.

13. The method of claim 9 wherein the rechargeable solid-state battery represented by the set of linear equations has an intercalation chemistry cathode and the second battery has a lithium iron phosphate cathode.

14. The method of claim 1 wherein the impedance value is selected from the group consisting of a layer electron transport resistance, a particle electron transport resistance, a layer ion transport resistance, a particle ion transport resistance, ion exchange effects modeled by a particle resistance, and a particle capacitance.

15. The method of claim 1 wherein the impedance value in each layer is calculated from a layer electron transport resistance, a particle electron transport resistance, a layer ion transport resistance, a particle ion transport resistance, ion exchange effects modeled by a particle resistance, and a particle capacitance.

16. The method of claim 1 wherein the impedance value in each layer is modeled from a layer electron transport resistance, a particle electron transport resistance, a layer ion transport resistance, a particle ion transport resistance, ion exchange effects modeled by a particle resistance, and a particle capacitance.

17. The method of claim 1 further comprising:
turning on or off or modulating a battery heater or cooler based upon a measured temperature from a temperature sensor.

18. The method of claim 1 wherein the aggregate SOC is transmitted to a fuel gauge or range estimator.

19. The method of claim 1 wherein the at least one processor and memory are part of a battery management system (BMS).

20. The method of claim 19 wherein the solving, computing, updating, and calculating are performed in real-time by the BMS.

21. The method of claim 1 further comprising:
updating the impedance value based on an environmental condition selected from the group consisting of the aggregate SOC, a hysteresis direction of load current, a magnitude of load current, and an age of the battery.

22. The method of claim 1 further comprising:
updating an ideal voltage source of each layer using the computed SOC for the layer; and
updating an impedance value of a cell stack based on an aggregate SOC of the battery and the temperature value from the sensor.

23. The method of claim 1 wherein the signaling is analog or digital.

24. A non-transitory computer-readable medium for regulating a load on a rechargeable solid-state battery having a charge gradient through a thickness of a layered cathode, the medium comprising instructions stored thereon, that when executed on a processor, perform the operations of:
providing a set of linear equations representing an equivalent circuit of a rechargeable solid-state battery, each equation of the set corresponding to either an individual layer of layers of an electrode or a cell stack of the layers;
solving, using at least one computer processor operatively coupled with a memory, the set of equations for an electrical current or voltage in each layer;
computing a state of charge (SOC) for each layer using the solved electrical current or voltage for the layer and using a previous SOC associated with the layer;
combining the computed SOC for each layer to compute an aggregated SOC;
receiving a temperature value from a temperature sensor within or proximate to the battery;
updating an impedance value or an ideal voltage source in each layer based on the SOC for each layer and the temperature value from the temperature sensor;
gauging, using a current sensor, a load current from the battery;
calculating a loaded terminal voltage of the battery based on the updated impedance values, the ideal voltage sources, the computed SOCs, and the load current; and
signaling a load device controller based on the computed aggregate SOC or the calculated terminal voltage.

25. A battery management system executing instructions in a computer program, the system comprising:
a computer processor; and
a memory operatively coupled with the processor, the processor executing instructions from the memory comprising:
program code for providing a set of linear equations representing an equivalent circuit of a rechargeable solid-state battery, each equation of the set corresponding to either an individual layer of layers of an electrode or a cell stack of the layers;
program code for solving, using at least one computer processor operatively coupled with a memory, the set of equations for an electrical current or voltage in each layer;
program code for computing a state of charge (SOC) for each layer using the solved electrical current or voltage for the layer and using a previous SOC associated with the layer;
program code for combining the computed SOC for each layer to compute an aggregate SOC;
program code for receiving a temperature value from a temperature sensor within or proximate to the battery;
program code for updating an impedance value or an ideal voltage source in each layer based on the SOC for each layer and the temperature value from the temperature sensor;
program code for gauging, using a current sensor, a load current from the battery;
program code for calculating a loaded terminal voltage of the battery based on the updated impedance values, the ideal voltage sources, the computed SOCs, and the load current; and
program code for signaling a load device controller based on the computed aggregate SOC or calculated terminal voltage.

26. A plurality of battery cells coupled with the battery management system of claim 25.

27. An electric or hybrid automobile comprising the battery management system of claim 25.

* * * * *